United States Patent [19]
Le Moigne et al.

[11] Patent Number: 5,180,463
[45] Date of Patent: Jan. 19, 1993

[54] METHOD FOR FORMING COATED MONOCRYSTALLINE PRODUCTS

[75] Inventors: Jacques Le Moigne; Annette Thierry, both of Strasbourg; Pierre Guerder, Pithiviers, all of France

[73] Assignee: Quartz et Silice, Courbevoie, France

[21] Appl. No.: 454,343

[22] Filed: Dec. 21, 1989

[30] Foreign Application Priority Data

Dec. 26, 1988 [FR] France ............... 88 17178

[51] Int. Cl.$^5$ .......................................... C30B 19/00
[52] U.S. Cl. ................................ 156/603; 156/600; 156/613; 156/DIG. 113
[58] Field of Search ...... 156/600, 603, 610, DIG. 113

[56] References Cited

U.S. PATENT DOCUMENTS

| | | | |
|---|---|---|---|
| 4,125,534 | 11/1978 | Yee | 260/315 |
| 4,208,501 | 6/1980 | Yee | 526/259 |
| 4,220,747 | 9/1980 | Preziosi et al. | 156/DIG. 113 |
| 4,684,434 | 8/1987 | Thakur et al. | 156/622 |
| 4,698,121 | 10/1987 | Thakur et al. | 156/DIG. 113 |
| 4,793,893 | 12/1988 | Thakur et al. | 156/DIG. 113 |

OTHER PUBLICATIONS

"Macromolecules"; Growth of Large-Area Thin Film-Single Crystals of Poly(diacetylenes); Thakur et al.; *American Chem. Soc.*; pp. 2341-2344; vol. 18, No. 11.
J. Le Moigne et al., Thin Film Epitaxy of Diacetylenes on Inorganic or Organic Substrates: Structure and Non-Linear Properties of Polymer Films, *SPIE*, vol. 971, pp. 173-177 (1988).
109 Chem Abstracts (10), Sep. 5, 1988, p. 28, No. 74314W.
Rickert et al., "The Formation of Single Crystal Films of Polydiacetylenes", *Mol. Cryst. Liq. Cryst.* (93), pp. 307-314 (1983).
T. Kanetake et al., "Highly Oriented Polydiacetylene Films by Vacuum Deposition", *Appl. Phys. Lett.*, 51 (23), pp. 1957-1959 (Dec. 7, 1987).

*Primary Examiner*—Robert Kunemund
*Assistant Examiner*—Felisa Garrett
*Attorney, Agent, or Firm*—Pennie & Edmonds

[57] ABSTRACT

A polydiacetylene coating layer deposited upon an organic microcrystal. The coating has a large, uniform surface area which is monoriented and without cracks. The preferred embodiment utilizes for the monomer a layer of [1,6-di- n(carbazolyl)-2,4-hexadiyne] deposited by epitaxy onto an acid orthophthalate monocrystal of an alkali metal, ammonium or thallium. The process of the invention comprises cleaving the acid orthophthalate monocrystal along its (001) plane; depositing a diacetylenic monomer onto the cleaved face of the crystal by heat evaporation under vacuum conditions, and polymerizing the monomer upon the crystal face. The coated layer may thereafter be removed from the crystalline substrate by applying a composition such as, e.g., cabon or an acrylic polymer onto the coating to form a backing therefore and separating the resultant monoriented film from the crystal by at least partially immersing the coated crystal in water.

14 Claims, 2 Drawing Sheets

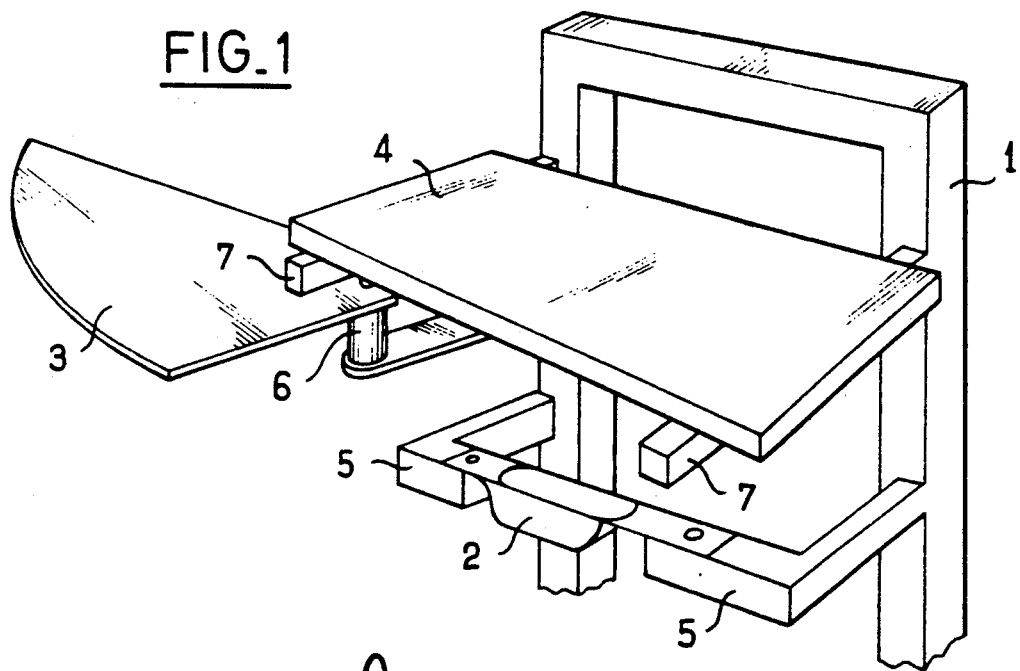
FIG_1
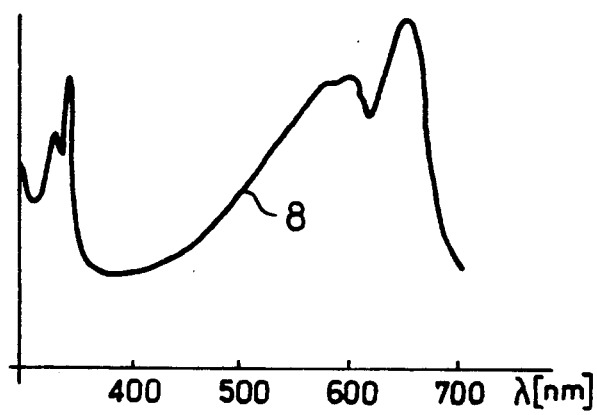
FIG_2
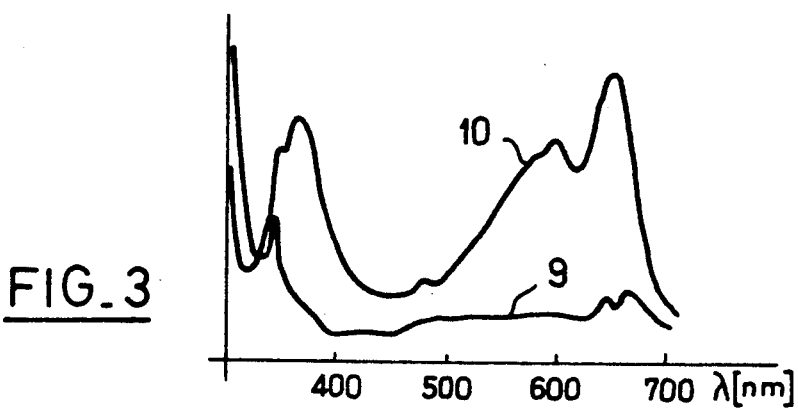
FIG_3

METHOD FOR FORMING COATED MONOCRYSTALLINE PRODUCTS

TECHNICAL FIELD

The present invention relates to coated monocrystalline products having an oriented polydiacetylene coating deposited on a monocrystal and a method for forming such coated products. The invention further relates to the use of these coated products in nonlinear optical applications.

BACKGROUND OF THE INVENTION

Thin organic layers having nonlinear optical properties and a surface area measuring several square centimeters offer a number of advantages. Such layers have many applications, particularly in the area of photorefringence, for uses such as the optical storage of data, logical functions and dynamic interconnections.

Polydiacetylene polymers having the general formula [R—C—C=C—C—R'] are known for having significant nonlinear susceptibilities of the third order ($x^{(3)}$). Of these polymers, monocrystalline polydiacetylene exhibits the highest values of $x^{(3)}$.

Previously known methods for preparing polydiacetylene crystals, however, have not resulted in the formation of products which are very useful. Although some known methods do result in the formulation of good quality polydiacetylene monocrystals, the dimensions of these products are relatively small, usually being less than 1 cm$^2$ in size. Moreover, the stresses produced within the crystal during polymerization can cause a number of defects within the product, even leading in some cases to the destruction of the crystal.

The formation of fine polycrystalline diacetyl layers permits avoidance of the problems described above caused by modification of the geometric parameters of the crystalline lattice during polymerization. With this method, however, it is generally possible to maintain the crystalline order only on the scale of the microcrystal. The arrangement of the microcrystals is most often random and thus the macroscopic value of the cubic capacity of such crystals is averaged over all the possible orientations.

The process of "epitaxy" permits an oriented growth of a substance by depositing it upon a monocrystalline substrate. This process has been utilized with polydiacetylenes in a variety of applications. Mineral monocrystals such as KCl or KBr are normally utilized as supports, leading in general to the formation of bioriented polycrystalline layers whose nonlinear optical properties are difficult to use practically.

Thus, at present, the methods utilized to form polydiacetylene crystals tend to result either in small, fragile monocrystals or in polycrystalline layers which, because they lack a single orientation, do not provide the optical performance otherwise expected from crystalline polydiacetylenes. The process of the present invention, in contrast, produces a product which reconciles these two requirements, i.e., the large, non-linear capacities of the mono-oriented layers and the large optical surface quality obtainable with microcrystalline films.

Monocrystalline polydiacetylene layers have previously been obtained by methods such as those disclosed in U.S. Pat. No. 4,684,434 to Thakur et al. The method described by this reference is carried out in two stages, the first involving the creation of a liquid layer wherein the monomer is either in the molten state or in solution, following which the liquid layer is placed between two surfaces comprised of glass, quartz or monocrystals of mineral salts and subjected to an elevated pressure. In the second stage of the process, the monomer solidifies, either due to the slow evaporation of the solvent or by slow cooling. The monomer is subsequently polymerized by exposure to ultraviolent radiation and the monocrystals thus obtained can reach several tenths of a square centimeter in surface area.

An alternate method for the formation of monocrystaline polydiacetylene layers is described in *Applied Physics Letters*, 51 (23), 1957 (1987). The process disclosed by this reference makes it possible to obtain polycrystalline layers having a surface area of several square centimeters, with good alignment of the crystals relative to one another. The process comprises a first step of melting the purified monomer in a quartz crucible, heating the melted monomer to 125° C. under a vacuum of $8-10^{-4}$ Pascals and collecting the condensate upon a glass substrate maintained at a temperature of 10° C. This produces a monomer film, having a thickness of several tens of nanometers. In a second stage, the film is polymerized in air by ultraviolet radiation, resulting in the formation of an isotropic film.

The crystals are oriented in a third step, during which the polycrystalline layer is rubbed lightly in one direction with a silicone cloth. The layer is thus thinned and the residual crystals are oriented at the surface of the glass substrate. The steps described above may be repeated several times in order to form a film several hundred nanometers thick, comprising polycrystals whose face (010) is parallel to the substrate and whose direction [001] is aligned with the direction of mechanical friction imparted by wiping the polycrystalline layer with the silicon cloth. However, the above-described process is known to result in cracks extending perpendicular to the direction of friction that introduce discontinuities into the coating layer.

With the use of a third method, described for example in *Journal of Chemical Physics*, 88 (10), 6647 (1988), the crystal orientation is obtained by epitaxy, i.e., a polycrystalline layer is deposited upon a mineral monocrystal on which the small unit crystals are oriented. In the reference described above, monomer crystals of [1,6-di-(n-carbazolyl)-2,4-hexadiyne] are heated in a crucible under a vacuum of $10^{-5}$ Pa. A freshly cloven monocrystal, e.g., KBR, on which the monomer is to be deposited, is placed at a distance from the crucible. A uniform film is obtained, which is then heated to a temperature of 150° C. to complete the polymerization reaction.

A variant of this method utilizes an organic monocrystal of 2-5 piperazine-dione. Continuous films may thus be obtained having a thickness of 25 nm or more with a large surface area and comprising bioriented polycrystals. The diffraction spots are split and the corresponding angle is at least 10°.

Thus it may be seen that the first of the three techniques described above results in the formation of a layer comprising small monocrystals, whereas the third technique provides an oriented polycrystalline layer which is bioriented. The second technique is exceedingly laborious and difficult to use in industrial processes. The application of mechanical friction, i.e., by rubbing with a silicon cloth, leads to the formation of cracks within the final coating.

SUMMARY OF THE INVENTION

The product produced by the method of the present invention has a large, uniform surface area which is monoriented and without cracks. This product comprises a polydiacetylene layer deposited by epitaxy on an organic monocrystal. The organic monocrystal comprises aromatic radicals, with the orthophthalates being considered particularly suitable. The invention particularly relates to a polydiacetylene layer deposited by epitaxy on an acid orthophthalate monocrystal of an alkali metal, ammonium or thallium.

One embodiment of the present invention utilizes [1,6-di-n(carbazolyl)-2,4-hexadiyne] as the diacetylene. The support crystal is preferably freshly cloven along a plane [001]. The polydiacetylene layer obtained is polycrystalline with a monocrystalline bottom formed by crystals measuring from 0.1 to 0.3 micron. The layer supports parallel needle-shaped crystals from 2 to 6 microns in length.

The invention also relates to a process of making a product comprising an oriented microcrystalline polydiacetylene layer. This method comprises the following steps:

(a) cleaving an acid orthophthalate monocrystal formed of an alkali metal, ammonium or thallium along a plane [001];

(b) depositing a diacetylenic monomer layer on the cleaved face of the crystal by heat evaporation under vacuum conditions; and (c) polymerizing the monomer layer.

Preferably [1,6-di-(n-carbazolyl)-2,4-hexadiyne] is chosen as the diacetylene; and the heat evaporation step (step b) is carried out at a temperature of between about 150°-240° C. under a vacuum of less than $10^{-4}$ Pa.

The polymerization of the diacetylene in step c above is advantageously performed at a temperature of between about 140°-170° C. wherein the polymerization temperature is inversely proportional to the duration of the polymerization step. In addition, cleavage of the orthophthalate monocrystal should be carried out just before the monomer is deposited thereon. This prevents degradation of the virgin crystalline surface by the surrounding environment. Under ambient atmospheric conditions, the coating should be applied no more than three (3) minutes after cleavage of the crystal to prevent such degradation.

A further aspect of the invention relates to the use in non-linear optical applications of such coated crystals, wherein the polydiacetylene layer is deposited by epitaxy upon an acid orthophthalate monocrystal of an alkali metal, ammonium or thallium.

BRIEF DESCRIPTION OF THE DRAWINGS

These and other objects, features and advantages of the invention will be more readily apparent from the following detailed description of the invention in which:

FIG. 1 is a perspective view of an apparatus for carrying out the process of the invention;

FIG. 2 illustrates the transmission spectrum of a polydiacetylene layer deposited upon amorphous silica;

FIG. 3 illustrates the transmission spectrum obtained for a polydiacetylene layer formed according to the process of the invention with polarized light whose polarization planes are respectively parallel and perpendicular to axis b of potassium acid phthalate (KAP) crystals.

DETAILED DESCRIPTION OF THE PREFERRED EMBODIMENTS

Figure 4:
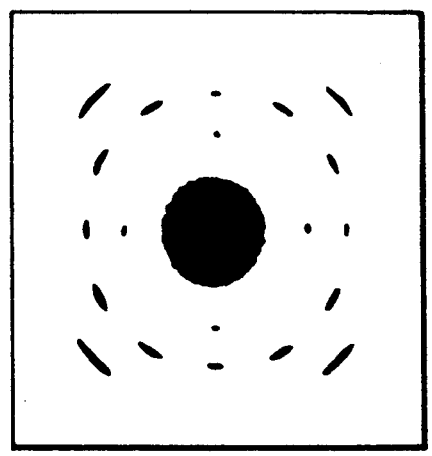
FIGS. 4, 5 and 6 illustrate the appearance of electron diffraction images obtained from various polydiacetylene polycrystalline layers deposited by epitaxy on, respectively, potassium bromide (KBr), potassium acid phthalate (KAP) and rubidium acid phthalate (RbAP).

Turning initially to FIG. 1 there is illustrated an apparatus for use in carrying out the process of the invention. This process results in the formation of a polydiacetylene product oriented upon an acid phthalate monocrystal. The subject apparatus is preferably located within a vacuum chamber, which permits the use of a technique known as "deposition by molecular jet" with a diacetylene monomer.

The various elements of the device are attached at a gantry 1. These elements include, successively, from bottom to top, a crucible 2, a moveable shutter 3 and a substrate 4.

Crucible 2 is preferably formed of tantalum and is carried mechanically by two rigid arms 5 formed of an insulating material. Crucible 2 is connected to two power leads (not shown) through which it can be subjected to a variable voltage to bring crucible 2 to a desired temperature. This temperature may be measured with the use of a platinum resistance probe (not shown).

Shutter 3, which has the shape of a sector of a circle, is supported upon the shaft of a motor 6. This arrangement makes it possible, by rotating shutter 3, to control the deposition of the substance in crucible 2 upon substrate 4.

Substrate 4 rests on supports 7 in a manner such that its lower face is exposed to the vapor produced upon the heating of crucible 2. For the best results, substrate 4 should preferably be positioned about 10 cm from crucible 2.

The apparatus illustrated in FIG. 1 is adapted for operation as discussed above within a vacuum installation (not shown) capable of standard ultrahigh vacuum conditions. A quartz (not shown) is placed in the lower plane of the substrate to permit monitoring of the coating operation. The frequency variations of the quartz permit the operator of the installation to determine, in a standard manner at any time during the coating procedure, the surface mass of the deposit.

To obtain the product of the invention, the freshly cloven surface of an acid phthalate monocrystal of an alkali metal, ammonium or thallium is positioned upon supports 7. The crystal is cleaved by impacting it with a blade parallel to its (001) plane. As noted above, it is important to minimize the interval between the cleaving of the crystal and its introduction into the vacuum installation. Preferably, this time span should not exceed three minutes. The thickness of the monocrystal does not have any effect upon the process.

The presently disclosed process is thus carried out as described below. A sufficient amount of a purified, crystallized diacetylene monomer is introduced in the form of fine needles into crucible 2. The monomer may, for example, be prepared by the method described in U.S. Pat. No. 4,125,534 to Baughman et al. This entails, for example, the use of [1,6-di-(n-carbozolyl)-2,4 hexadiyne], referred to below as monoDCH. The amount of the monomer chosen for use is defined empirically. It depends both upon the desired thickness of the polymer layer and the geometry of the coating installation.

When the vacuum reaches a value on the order of $10^{-5}$ Pa within the installation described with regard to FIG. 1, which in conventional vacuum installations takes about five hours, an electrical current is passed through crucible 2 while shutter 3 is maintained in a closed position. When the temperature of crucible 2 reaches 180° C., shutter 3 is opened. The surface mass of the layer deposited upon the quartz, which is close to the amount deposited upon the substrate, is continuously measured. When the desired coating thickness is reached, shutter 3 is closed and the electrical current to crucible 2 is terminated. Argon is thereafter introduced into the enclosure, which is opened once it returns to atmospheric pressure.

The coated monocrystal is then transferred into a heated enclosure to polymerize the coating. The time span for the polymerization process depends upon the temperature of the heated enclosure. For example, when a monocrystal coated with DCH is maintained at 150° C. in air, the polymerization process requires about 3 hours and, preferably 24 hours. If it is desired to reduce the time span to a significant degree, the polymerization step may be carried out in an inert atmosphere, for example, of nitrogen. At 170° C. the time required for polymerization in such an atmosphere is reduced to about one hour.

As demonstrated in FIGS. 2 and 3, the epitaxied polycrystalline layer combination of polydiacetylene on acid alkaline phthalate produced according to the present invention yields greatly improved optical properties. In FIG. 2 a trace 8 of the optical density in arbitrary units is shown as a function of wavelength (in nanometers) in the case of the polyDCH layer obtained with a prior art method similar to that described above but utilizing amorphous silica as a support. The thickness of the monomer layer used for these measurements was 100 nm. Although such a layer is polycrystalline, the orientation of the microcrystals is random. The optical density at a given wavelength does not depend upon the state of polarization of the light and thus no pleochroism is observed.

In contrast, a polyDCH layer deposited upon an orthorhombic potassium-acid orthophthalate (KAP) monocrystal with a monomer thickness of 30 nm exhibits a clear pleochrosim. As shown in FIG. 3, curve 9, which illustrates the optical density obtained when the polymerization plane of the light is parallel to axis b of the crystal, is very different from curve 10 which depicts the optical density obtained with polarized light having a polarization plane perpendicular to axis b.

The pleochrosim of the coating is simply a manifestation, in linear optics, of the anisotropy of the crystal. The formation of layers according to the method of the invention, however, makes possible the construction of nonlinear optical systems such as, for example, optical bistables, entirely optical modulators and generators of third harmonics for high energy densities.

EXAMPLES

The following examples are provided for the purpose of illustration only and should not be construed as limiting the invention in any manner.

EXAMPLE 1

This example, which will serve as a reference, describes a technique for depositing the monomer upon a mineral monocrystal which is designed to allow the occurence of some sort of epitaxy. The apparatus utilized was that illustrated in FIG. 1. The monocrystal was cubic potassium bromide (KBr). The cleavage of the crystal was performed just before the substrate was introduced into the vacuum enclosure. The substrate had a thickness of 2 mm.

An excess of fine DCH powder obtained by coupling a molecule of [3-(9-carbazoyl)-1-propyne] was introduced into crucible 2. The precursor of the carbozolyl propyne was obtained by the standard method with the use of butyllithiur. The fine crystallized needles of DCH were precipitated from an acetone-toluene solution. The formula of DCH is:

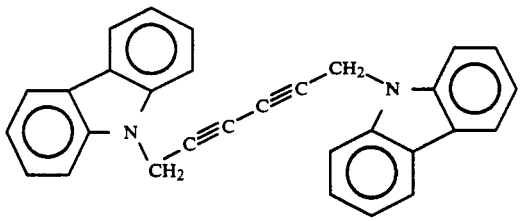

An analysis of this material by weight provides the following results:
Carbon=88.3%
Hydrogen=4.9%
Nitrogen=6.8%

After establishing the ultrahigh vacuum within the enclosure, an electrical current was passed through the crucible while the shutter was closed. When the temperature reached 180° C., the shutter was opened for sixty seconds and then closed. A coating having a thickness of 27 nm was thus deposited.

Once the heating of the crucible was terminated, argon gas was introduced into the enclosure prior to the entrance of any ambient air. The monocrystalline substrate was then placed in an oven where it was maintained for 24 hours at 150° C. in order to complete the polymerization of the DCH. The polyDCH film was then covered with a coating of carbon to provide support for the film and separated from the substrate by placing the coated crystal into water. This film was then collected upon the grid of an electron microscope and the electron diffraction picture thus obtained is illustrated in FIG. 4. This figure illustrates not only the good parallelism of the microcrystals (dispersion ±4°), but also their biorientation.

Example 1 thus demonstrates how a polydiacetylene film may be evaluated when it is separated from the monocrystalline substrate. This technique may also be used to evaluate coatings produced according to the invention. Alternately, in place of carbon, the polymerized film may instead be coated with a solution of an acrylic polymer such as polymethylmethacrylate (PMMA). Once the acrylic polymer layer has dried, the polydiacetylene film with its acrylic polymer backing may be separated from the monocrystalline substrate and utilized, for example, in various optical applications.

EXAMPLE 2

This example was carried out in a manner identical in all respects to Example 1 except that the substrate in this case was a KAP monocrystal cloven along the (001) plane just prior to its introduction into the enclosure. The thickness of the monocrystal utilized was 0.27 mm.

Figure 5:
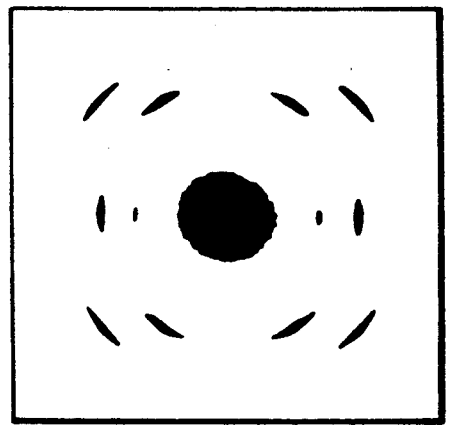

The electron diffraction diagram of the resultant polymer is illustrated in FIG. 5. The microcrystals had a single orientation (the number of diffraction spots was one-half of that seen for Example 1) and a low dispersion of ±8° was noted.

EXAMPLE 3

The substrate in this case was a KAP monocrystal having a thickness of 0.91 mm. The crystal was formed in the shape of an isosceles triangle with a base measuring 95 mm and sides of 55 mm. The amount of DCH placed in the crucible was greater in this instance, which results in different reaction conditions, i.e., the crucible was heated to obtain a rate of deposition of 0.8 to 1 nm/sec and, at the end of the operation, the temperature was raised to 240° C. A layer having a thickness of 145 nm was obtained which, after being polymerized, appeared bluish in natural light and acted as a polarizer.

EXAMPLE 4

Figure 6:
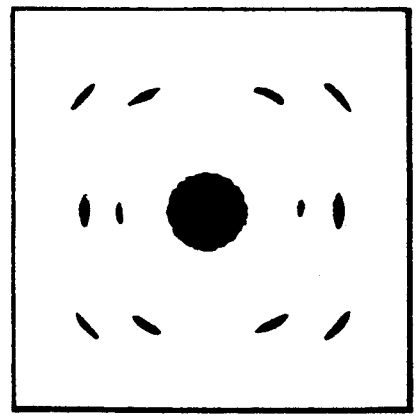

The reaction conditions utilized were those of examples 1 and 2. The substrate in this instance, however, was a rubidium acid orthophthalate (RbAP) monocrystal. The crystal was cloven just prior to its introduction into the enclosure and had an (uncoated) thickness of 0.92 mm. The shutter was opened for one minute when the temperature of the crucible reached 180° C. The deposited DCH monomer had a thickness of 32 nm. Upon polymerization of the coating layer, it was observed with an electron microscope. The diffraction diagram for the subject layer is illustrated in FIG. 6. The resultant microcrystals were mono-oriented and a dispersion of ±8° was noted.

While it is apparent that the invention herein disclosed is well calculated to fulfill the objectives stated above, it will be appreciated that numerous modifications and embodiments may be devised by those skilled in the art, and it is intended that the appended claims cover all such modifications and embodiments as fall within the true spirit and scope of the present invention.

We claim:

1. A process for forming a coated monocrystalline product which comprises:
   (a) cleaving an organic monocrystal comprising an orthophthalate material to produce a face thereupon which is substantially free from environmental degradation;
   (b) depositing a coating of a diacetylene monomer upon at least a portion of said face; and
   (c) polymerizing said monomer upon said face so as to form a monooriented polydiacetylene layer thereupon.

2. The process of claim 1 wherein said monocrystal is cloven along its (001) plane.

3. The process of claim 1 wherein said diacetylene monomer is deposited upon said face by heating said monocrystal under substantially vacuum conditions during said deposition step.

4. The process of claim 3 wherein said monocrystal is heated to a temperature of between about 150°-240° C. during said deposition step.

5. The process of claim 4 wherein said monocrystal is maintained at a vacuum of less than about $10^{-4}$ Pa during said deposition step.

6. The process of claim 1 wherein said monomer is polymerized upon said face by heating said coated monocrystal to a temperature of between about 140°-170° C. for a period of between about 1 to 24 hours.

7. The process of claim 6 wherein the period and the temperature at which said polymerization occurs are inversely proportional.

8. The process of claim 1 wherein said monomer is deposited within less than about three minutes after said monocrystal is cleaved.

9. A process for coating an organic monocrystal with an oriented microcrystalline polydiacetylene layer which comprises:
   (a) cleaving an acid orthophthalate monocrystal formed of a material selected from an alkali metal, ammonium and thallium along its (001) plane to produce a face thereupon which is substantially free from environmental degradation;
   (b) depositing a coating of [1,6-di-(n-carbazolyl)-2,4-hexadiyne] upon at least a portion of said face at a temperature of between about 150°-240° C. and under a vacuum of less than about $10^{-4}$ Pa; and
   (c) polymerizing said [1,6-di-(n-carbazolyl)-2,4-hexadiyne] upon said face at a temperature of between about 140°-170° C. for a period of between about 1 and 24 hours, so as to form a monoriented polydiacetylene layer thereupon.

10. The process of claim 6 wherein said polymerization is carried out in an inert atmosphere to reduce the time for polymerizing said monomer.

11. The process of claim 9 wherein said polymerization is carried out in an inert atmosphere to reduce the time for polymerizing said [1,6-di-(n-carbazolyl)-2,4-hexadiyne].

12. The process of claim 1 wherein said coated orthophthalate crystal has a surface area measuring at least about several square centimeters.

13. The process of claim 9 wherein said coated acid orthophthalate monocrystal has a surface area measuring at least about several square centimeters.

14. A process for forming a coated monocrystalline product which comprises:
   (a) cleaving an organic monocrystal consisting essentially of an orthophthalate material to produce a face thereupon which is substantially free of environmental degradation;
   (b) depositing a coating of a diacetylene monomer upon at least a portion of said face; and
   (c) polymerizing said monomer upon said face so as to form a monoriented polydiacetylene layer thereupon.

* * * * *